United States Patent
Brenneis et al.

(10) Patent No.: US 12,181,546 B2
(45) Date of Patent: Dec. 31, 2024

(54) MAGNETIC FIELD SENSOR AND METHOD FOR MEASURING A MAGNETIC FIELD

(71) Applicant: Robert Bosch GmbH, Stuttgart (DE)

(72) Inventors: Andreas Brenneis, Renningen (DE); Janine Riedrich-Moeller, Leonberg-Warmbronn (DE); Robert Roelver, Calw-Stammheim (DE); Tino Fuchs, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 154 days.

(21) Appl. No.: 18/166,848

(22) Filed: Feb. 9, 2023

(65) Prior Publication Data
US 2023/0266415 A1 Aug. 24, 2023

(30) Foreign Application Priority Data
Feb. 18, 2022 (DE) .................... 10 2022 201 695.5

(51) Int. Cl.
*G01R 33/36* (2006.01)
*G01R 33/26* (2006.01)
*G01N 21/64* (2006.01)

(52) U.S. Cl.
CPC ......... *G01R 33/3692* (2013.01); *G01R 33/26* (2013.01); *G01N 21/6404* (2013.01)

(58) Field of Classification Search
CPC .. G01R 33/3692; G01R 33/26; G01R 33/323; G01R 33/032; G01N 21/6404; G01N 24/10
See application file for complete search history.

(56) References Cited

U.S. PATENT DOCUMENTS

2021/0011098 A1* 1/2021 Pham ................ G01N 24/10

FOREIGN PATENT DOCUMENTS

| DE | 10 2014 219 550 A1 | 3/2016 |
|---|---|---|
| DE | 10 2018 214 617 A1 | 3/2020 |
| DE | 10 2018 220 234 A1 | 5/2020 |

OTHER PUBLICATIONS

Akihiro Kuwahata et.al, Magnetometer with nitrogen-vacancy center in bulk diamond for detecting magnetic nanoparticles in biomedical applications, Scientific Reports, (2020), | https://doi.org/10.1038/s41598-020-59064-6 (Year: 2020).*

(Continued)

*Primary Examiner* — G. M. A Hyder
(74) *Attorney, Agent, or Firm* — Maginot, Moore & Beck LLP

(57) ABSTRACT

A method for measuring a magnetic field includes radiating a microwave field having a first frequency into at least one measuring location in a crystal, which comprises optically excitable color center defects at the measuring location, radiating excitation light and detecting resulting fluorescence light, applying a deformation force which results in local mechanical strain, wherein an applied first deformation force is selected such that the first frequency corresponds to a resonance frequency of the color center defects under the action of the first deformation force without the magnetic field to be measured and the detected fluorescence light becomes minimal. The method further includes placing the sensor into the magnetic field to be measured to bring about a shift in the resonance frequency and varying the applied deformation force to compensate the shift in the resonance frequency until a minimum fluorescence signal is again acquired at a second deformation force.

16 Claims, 9 Drawing Sheets

(56) References Cited

OTHER PUBLICATIONS

Schloss, J. et al., "Simultaneous Broadband Vector Magnetometry Using Solid-State Spins," Physical Review Applied, 2018, vol. 10, No. 3, 034044 (16 pages).
Xia, K. et al., "Nanometer-precision Non-Local Deformation Reconstruction Using Nanodiamond Sensing," Nature Communications, 2019, 10:3259 (9 pages).

* cited by examiner

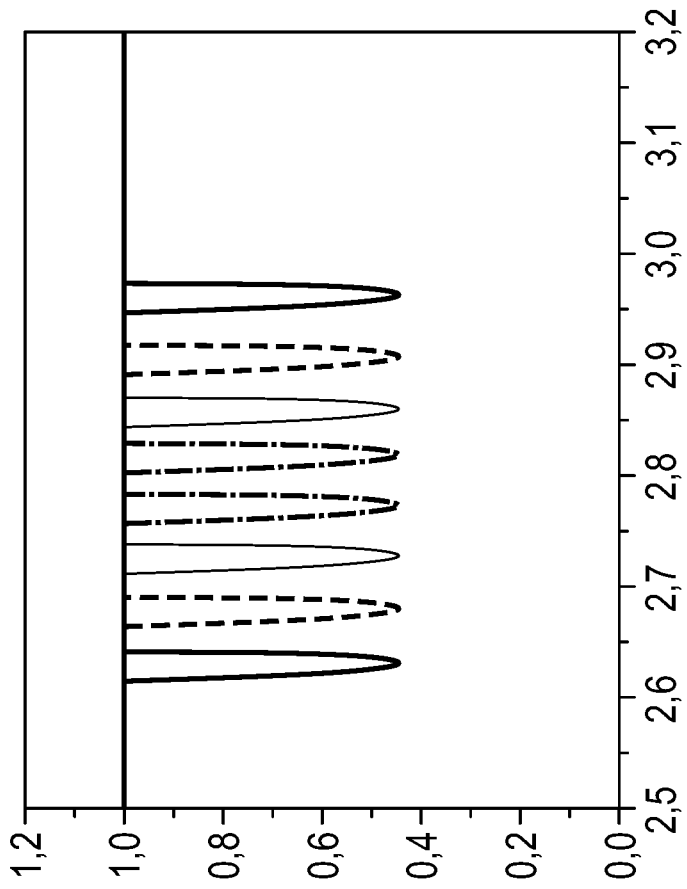
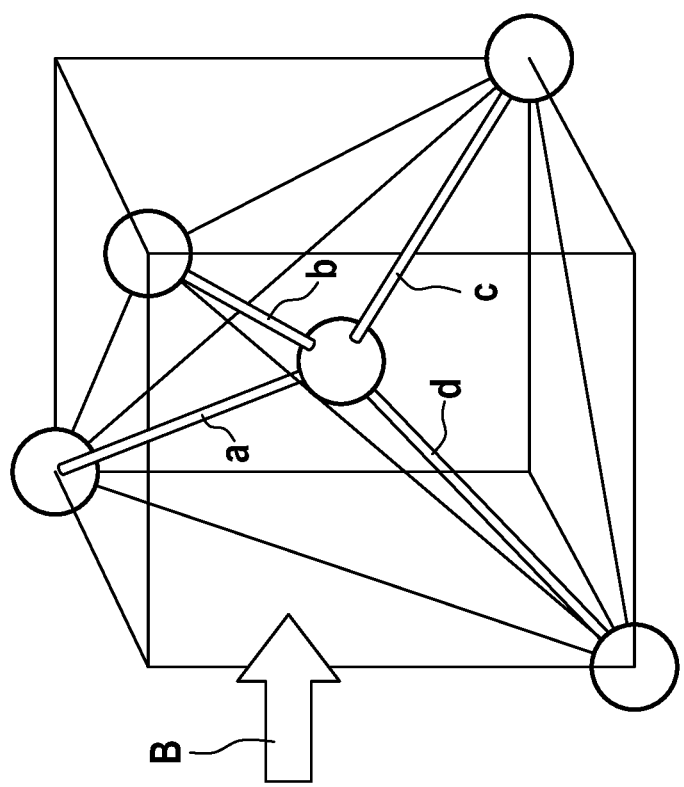
FIG. 1c
FIG. 1b

MAGNETIC FIELD SENSOR AND METHOD FOR MEASURING A MAGNETIC FIELD

FIELD

This application claims priority under 35 U.S.C. § 119 to application no. DE 10 2022 201 695.5, filed on Feb. 18, 2022 in Germany, the disclosure of which is incorporated herein by reference in its entirety.

The present disclosure relates to a magnetic field sensor, in particular on the basis of strain-induced magnetic resonance shifts, and to a method for measuring a magnetic field as well as a computing unit and a computer program for carrying out said method.

BACKGROUND

The most sensitive sensing technology currently available for magnetic field sensors is the use of superconducting quantum interference devices (SQUIDs), with which individual magnetic flux quanta can be resolved. These high sensitivities are needed to realize applications such as magnetoencephalography, i.e., the localized measurement of brain activity using the signal currents produced in neurons and the magnetic fields they induced. This requires a resolving power of a few picotesla (pT) for the magnetic sensors. A disadvantage of SQUIDs, however, is the need for cooling below the superconducting transition temperature, which for most superconducting materials is below 63 K, the temperature of liquid nitrogen.

Magnetometers based on nitrogen vacancies in diamond (NV centers), such as those presented in DE 10 2018 220 234 A1 or DE 10 2018 214 617 A1, are a sensing technology that can be operated at room temperature and has a similar sensitivity. This involves evaluating optically excited and read-out resonance frequencies which split in the magnetic field due to the Zeeman effect, wherein the frequency spacing of the split states is a function of the strength of the magnetic field to be measured. The sensor operation requires the application of a bias magnetic field, however, which can be realized by means of permanent magnets or magnetic field-generating coils. The disadvantage of permanent magnets is that their magnetization varies over their service life and also with temperature changes and consequently causes sensor drift of the diamond magnetometer. Current-carrying coils require a certain amount of installation space and increase the power required for sensor operation. A frequency controllable microwave source for the sensor is needed as well, which requires some additional system complexity.

SUMMARY

According to the disclosure, a magnetic field sensor and method for measuring a magnetic field as well as a computing unit and a computer program for carrying out said method are proposed. Advantageous embodiments are the subject matter of the following description.

Proposed is in particular a method for measuring a magnetic field, in which first a microwave field having a first frequency $f_0$ is radiated into at least one measuring location in a crystal, in particular a diamond crystal, which comprises optically excitable color center defects at least at the at least one measuring location. A diamond with nitrogen-vacancy centers (NV centers) is particularly suitable for this purpose, but the use of other color center defects to exploit the described effects are conceivable as well.

Excitation light is then radiated into one or more measuring locations and the resulting fluorescence light from the respective measuring location is detected. A deformation force is applied to the crystal, which results in local mechanical strain at least in the area of the measuring location. A first applied deformation force is first selected such that the first frequency (i.e., the radiated frequency of the microwave field) corresponds to a resonance frequency of the color center defects under the action of the first deformation force without the magnetic field to be measured and the detected fluorescence light becomes minimal. The magnetic field sensor is then placed into the magnetic field to be measured in order to bring about a shift in the resonance frequency. As a result, a fluorescence minimum is no longer detected at the first microwave frequency, but rather a higher fluorescence signal. The applied deformation force is then varied to compensate the shift in the resonance frequency until a minimum fluorescence signal is again acquired at a second deformation force. The force can be varied continuously or in predefined steps. It is also possible to use a suitable control for the deformation force which controls the achievement of the fluorescence minimum as the target value.

The deformation force recorded in this way can then in particular be used to determine the magnetic field into which the magnetic field sensor has been placed. The field strength is proportional to the shift in the resonance lines, whereas the frequency shifts are proportional to the applied force. Thus the field strength of the magnetic field to be measured can now be determined on the basis of a difference between the first and the second deformation force. For this purpose, the measurement module and thus also the sensor can already be configured to output the field strength. But it is also conceivable for the measurement module to output only the acquired values for the first and the second deformation force, which are then processed further in another unit for determining the magnetic field.

To achieve vector magnetometry, i.e., determine the field strengths in a direction-dependent manner, it is in particular also possible to radiate in microwave fields with more than one frequency, e.g., with 3 frequencies to obtain the field strength in three spatial axes. Since the color centers in the crystal have different orientations, the frequency shifts caused by the applied deformation force are also different depending on the direction, so that there are multiple resonance frequencies for which a respective microwave frequency can be selected. In this case, each of the radiated frequencies corresponds to a resonance frequency of the color center defects for an alignment axis of the color center defects in the crystal under the action of the first deformation force without the magnetic field to be measured. The deformation force can then be varied after introduction into the magnetic field until a minimum fluorescence signal is again acquired for each of the radiated frequencies at an associated further deformation force and the field strength of the magnetic field can be determined in a direction-dependent manner from these respective further deformation forces which are each assigned to a radiated frequency. The field strength of the magnetic field to be measured in the direction of the alignment axis assigned to the radiated frequency can in particular be determined on the basis of a difference between the first and the further deformation force.

Further proposed is a magnetic field sensor for measuring a magnetic field which comprises the following: a crystal, in particular a diamond crystal, which comprises optically excitable color center defects at least at one or more measuring locations; a fluorescence module for optically exciting the color center defects at at least one measuring location and acquiring the resulting fluorescence signal from the measuring location; an actuator for producing mechanical strains at least at one or more of the measuring locations in the crystal using a defined variable deformation force; a microwave generator for producing a microwave field with a predetermined frequency at the at least one measuring location; and a measurement module which is configured to control the actuator depending on the acquired fluorescence signal and to detect the deformation force applied by the actuator at least at a fluorescence minimum. Such a magnetic field sensor makes it possible to observe the shift in the excited resonances caused by the magnetic field and, from that, determine the magnetic field. Such a sensor can be produced with very small dimensions, in particular as a MEMS (microelectromechanical systems) component, and does not require any complex shielding or cooling systems. Small field strengths are nevertheless easily measurable.

The measurement module of the sensor can in particular be configured to control the actuator to apply a first deformation force which is selected such that the first frequency corresponds to a resonance frequency of the color center defects under the action of the first deformation force without the magnetic field to be measured and the detected fluorescence light is minimal and control the actuator to vary the applied deformation force if the detected fluorescence light is no longer minimal due to the action of an external magnetic field until a minimum fluorescence signal is again acquired at a second deformation force. The measurement module can optionally also be configured to determine the field strength of the magnetic field to be measured on the basis of a difference between the first and the second deformation force. However, it is also possible for the measurement module to only output the applied deformation forces to another unit (or even only the control signals that were used to control the actuators at the respective force, e.g., the used piezo voltage). In that case, the magnetic field can then be determined from the values output by the measurement module outside the sensor or, for example, in another control unit of a larger system. The application and evaluation of a variable deformation force makes it possible to compare the resonance frequencies without having to tune the microwave spectrum; thus a very narrowband microwave generator, for example, can be used.

The crystal in the magnetic field sensor can be partly or entirely configured as a crystal membrane, for example. Such a membrane can easily be deflected with the smallest of forces and is sufficient to detect the described effects. The membrane can have a thickness of a few micrometers, for instance, e.g., between 1 and 10 micrometers. The surface area of the membrane depends on the mounting and the accommodation of other components, such as photodetectors and light sources, but can be in the mm range, for example, and thus enable very compact sensors. A crystal membrane can be mounted or disposed in other components, but it is also conceivable to cut recesses into a somewhat larger and thus more stable crystal section at the required locations in such a way that a thin membrane is created in an area that is equipped with the respective color center defects at least in specific areas. In further embodiments, such a membrane can also comprise recesses that alter the deformation and/or strain properties of the crystal membrane.

In other embodiments, for example, the crystal can be partly or entirely configured as a crystal bending beam which can be rigidly attached on one or on both sides.

The fluorescence module can comprise at least one excitation light source for radiating excitation light into one or more of the measuring locations and at least one photodetector for detecting fluorescence light at one or more of the measuring locations, wherein the crystal can optionally be configured as an optical waveguide for guiding excitation light to one or more of the measuring locations and/or for guiding fluorescence light away from one or more of the measuring locations to a photodetector. The excitation light and/or fluorescence light can be coupled into or out of the crystal by suitable coupling structures known in the art. The design of a magnetic field sensor is thus simplified and can be further miniaturized, because the elements of the fluorescence module do not have to be located directly in the area of the measuring locations (e.g., the crystal membrane).

The actuator for deforming or straining the crystal can comprise a piezoelectric actuator, for example, or an electrostatic actuator. Such actuators are particularly easy to integrate in MEMS systems and can be controlled in a defined manner. However, all other actuators that can apply a defined force to the crystal are conceivable as well.

In embodiment examples of a magnetic field sensor, the crystal can be mounted on a carrier substrate such that a recess is formed between the substrate and the measuring locations, wherein the actuator is disposed on the crystal such that deflection of the crystal by the actuator is possible at least in portions of the crystal. A compact and protected design can thus be made possible and other elements such as the actuator or parts of the fluorescence module (e.g., photodetectors) can be disposed in a space-saving manner in the recess as well.

The at least partial implementation of a method according to the disclosure in the form of a computer program or computer program product comprising program code for carrying out all method steps is also advantageous, because the associated costs are very low, in particular if an executing computing unit is also used for other tasks and is therefore already available. Lastly, a machine-readable storage medium is provided, on which the computer program is stored as described above. Suitable storage media or data carriers for providing the computer program are in particular magnetic, optical and electrical memories such as hard disks, flash memory, EEPROMs, DVDs, etc. Downloading a program via computer networks (internet, intranet, etc.) is possible as well. Such a download can be wired or cabled or wireless (e.g., via a WLAN, a 3G, 4G, 5G or 6G connection, etc.).

Further advantages and embodiments of the disclosure will emerge from the description and the accompanying drawing.

BRIEF DESCRIPTION OF THE DRAWINGS

The disclosure is illustrated schematically in the drawing on the basis of embodiment examples and is described in detail in the following with reference to the drawing.

FIGS. 1b and 1c illustrate the effects of a magnetic field on the resonance lines of the NV centers in diamond;

DETAILED DESCRIPTION

Figure 1A:
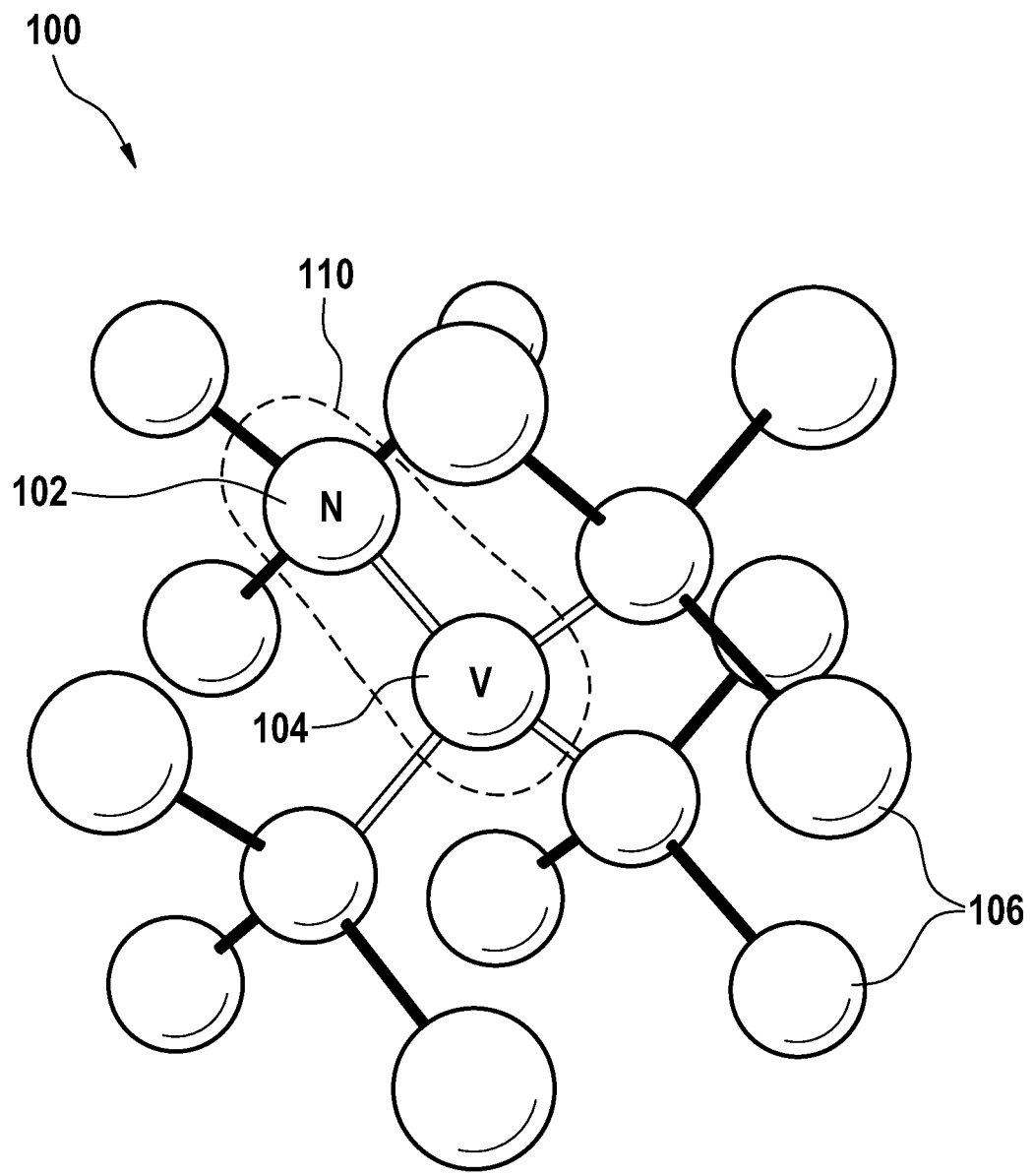
FIG. 1a schematically shows a diamond crystal lattice comprising an NV center.

Diamond NV magnetometers are based on reading out magnetic resonances from special defect centers in diamond, in particular nitrogen vacancies (NV), which occur as impurities in the carbon lattice of diamond and can also be introduced in a targeted manner. FIG. 1a shows an example of a schematic section of a diamond crystal lattice 100 comprising an NV center 110. A nitrogen vacancy center 110 describes a pair of a nitrogen atom 102 which replaces a single carbon atom 106 of the diamond lattice and an adjacent vacancy 104 in the lattice. If the NV center 110 is optically excited in the normal state without the presence of a magnetic field, e.g., by radiating in a pump laser beam having a suitable wavelength (in this case in the green wavelength range, e.g., at 532 nm for off-resonance excitation), the electrons are lifted from the triplet ground state to the excited triplet state and relax while emitting fluorescence light in the red wavelength range at 637 nm. Since the probability of non-spin-conserving transitions from the spin state is higher when the spin quantum number $m_s = \pm 1$, continuous excitation pumping ensures that the NV centers are largely polarized in the spin state $m_s = 0$.

There is an energy difference between the $m_s = 0$ and $m_s = \pm 1$ spin states in the ground state, which in this case is about 2.87 GHz. Thus, if microwave radiation is radiated into the diamond in addition to the optical excitation, there is a dip in the red fluorescence at this resonance frequency of 2.87 GHz, because the spin-polarized electrons are lifted by the microwave field from $m_s = 0$ to the $m_s = \pm 1$ ground state and excited from there by the pump light to the $m_s = \pm 1$ excited state. From there, however, primarily non-radiative transitions and weak infrared fluorescence transitions occur via the singlet state, and the fluorescence in the red range ceases.

If an external magnetic field is present, the so-called Zeeman effect leads to the splitting of the otherwise energetically equal $m_s = \pm 1$ triplet levels into energetically equidistant Zeeman levels. Plotting the fluorescence against a frequency spectrum of the microwave excitation then reveals two dips in the fluorescence spectrum, the frequency spacing of which is linearly proportional to the magnetic field strength of the external magnetic field. The magnetic field sensitivity is primarily defined by the minimally resolvable frequency shift and can reach up to 1 pT/√gHz.

Since the NV center in the single crystal diamond lattice has four possible orientations, the presence of a directed magnetic field causes the various NV centers present in the crystal to react differently to the external magnetic field depending on their orientation. This is shown as an example in FIG. 1b using a crystal unit cell of diamond. The letters a to d indicate the four possible orientations of the NV centers in the diamond lattice. In the zero field, i.e., with no applied magnetic field or with very small fields, the spin transitions of all four orientations are excited at substantially the same microwave frequency, so that the observable resonance corresponds to the sum of all orientations and produces only one dip in the spectrum. However, as soon as an external magnetic field is applied, as indicated by the arrow on the side, frequency splits occur in the resonance spectrum as already generally described above. Thus, if the present magnetic field comprises different field components in all four possible axes, four separate pairs of fluorescence minima are obtained in the spectrum when the microwave frequency is tuned, wherein the strength of the splitting (i.e., the observed frequency spacing) depends on the strength of the respective associated magnetic field component.

FIG. 1c shows a corresponding example of a resonance spectrum under the influence of an external directed magnetic field, in which the microwave frequency in gigahertz is plotted against the fluorescence intensity, wherein eight fluorescence minima can be seen, two of which in each case belong to one respective axis component. Thus, both the magnetic field strength and the direction of the external magnetic field can be clearly determined from such a spectrum.

Another property of the NV centers is that the energy levels also react to strains and deformations of the diamond crystal. When the crystal expands along the axis of symmetry of an NV center, the distance between the base level and the m−1 or m+1 level decreases, which is accompanied by a uniform frequency shift of the associated fluorescence minima. In the case of an anisotropic deformation of the crystal, the extent of which is different in different directions, different frequency shifts are obtained for each direction.

Figure 2A:
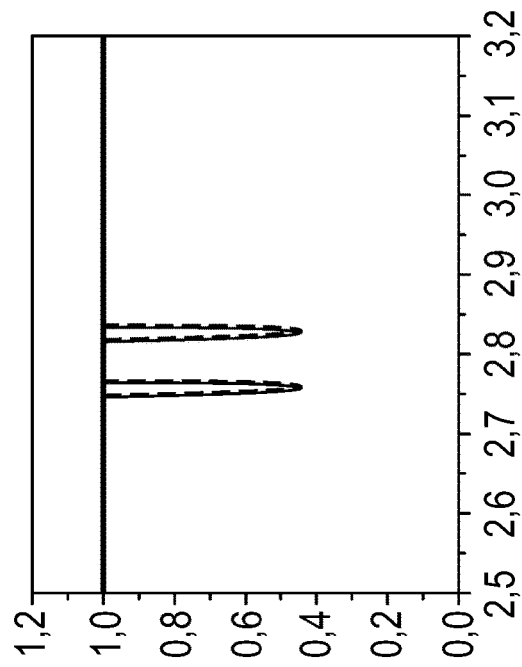
FIGS. 2a and 2b illustrate the effects of mechanical strain on the resonance lines of the NV centers in diamond.
Figure 2A:
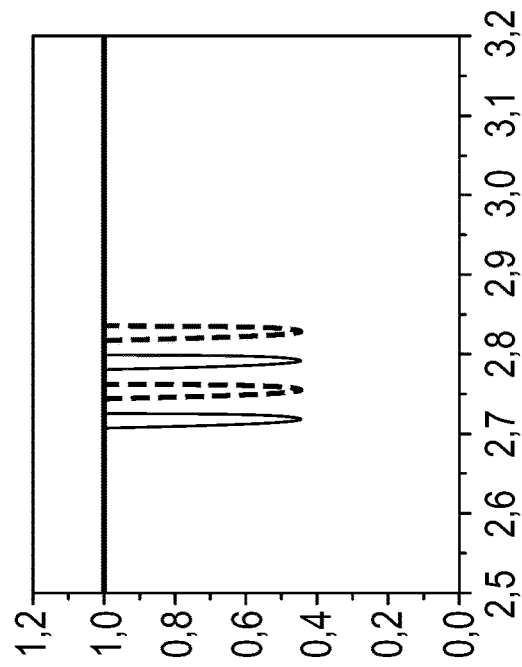
Figure 2A:
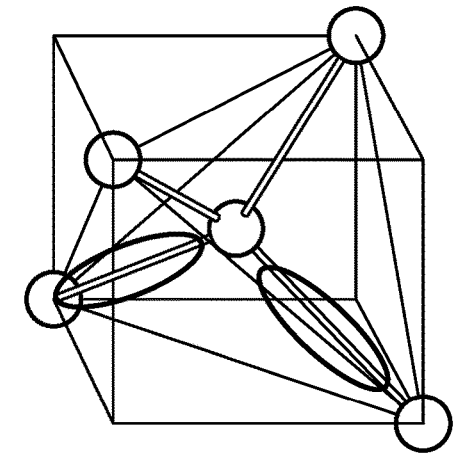
Figure 2B:
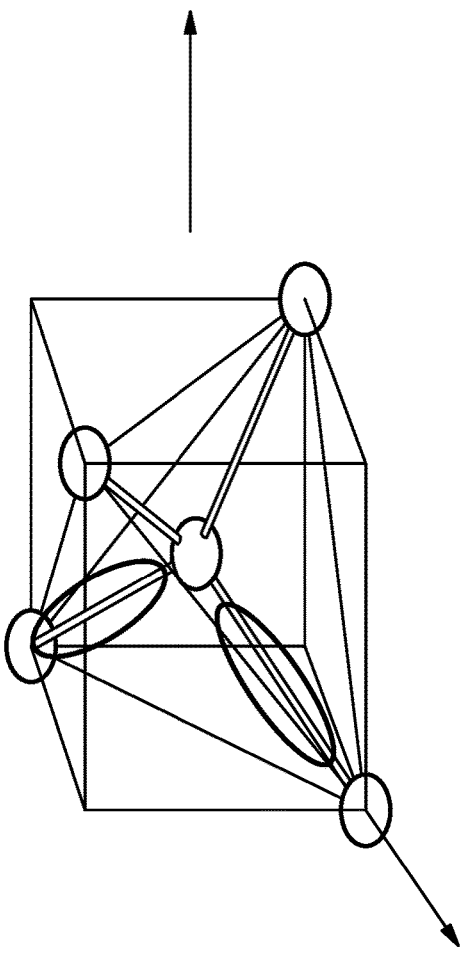

An example of the effects of axial strain on the optically detectable magnetic resonances is shown in FIGS. 2a and 2b. The left part of the figure again shows the unit cell of diamond. For the sake of simplicity, only two orientations are considered here. FIG. 2a shows the case without mechanical strain or deformation with a graph in which the microwave frequency is again plotted against the fluorescence intensity. In this case, in the simplest scenario, two fluorescence minima are obtained by means of an external magnetic field. FIG. 2b schematically indicates crystal strain in the diamond which acts along one of the possible NV center axes, e.g., due an application of mechanical force. The extension in this direction shifts the fluorescence component for this axis, so that now two additional fluorescence minima at shifted resonance frequencies are visible in the spectrum. Thus, an anisotropic deformation of the diamond can already cause a splitting of the magnetic resonances as a function of the crystal axes without the effect of an external magnetic field.

It goes without saying that the purpose of FIGS. 1 and 2 here is only to explain the principle of operation and that it is not a single NV center that produces these different frequency splits; rather, the number of NV centers will be approximately evenly distributed across the four possible orientations in a measuring region, so that all transitions in the spectrum can be observed. The deformation of the crystal, too, is shown only for illustrative purposes and is not to scale.

The shift in the magnetic resonance lines caused by the deformation can now be utilized according to embodiment examples of the disclosure to measure a magnetic field. The magnetic field can be measured by first measuring magnetic resonances under strain in a (diamond) crystal in a sensor according to embodiment examples of the disclosure, then exposing the sensor to the magnetic field and readjusting the strain in the crystal by applying a variable external force such that the fluorescence always remains minimal when a fixed microwave frequency is radiated in. The resonance splitting in the unknown magnetic field and the associated shift in the resonance frequency is thus counteracted by a frequency shift of equal magnitude due to a known mechanical strain.

An anisotropic deformation can be brought about by an action of force on a crystal structure, for example. In particular an at least partially free-floating design, such as a bending beam supported on one or both sides, a spring structure, or a membrane over a cavity, is useful in this context. A crystal configured in this way can then only be stretched or compressed in a specific direction depending on how it is mounted. Electrostatic or piezoelectric actuators, for example, can then be used to apply a force.

Figure 3A:
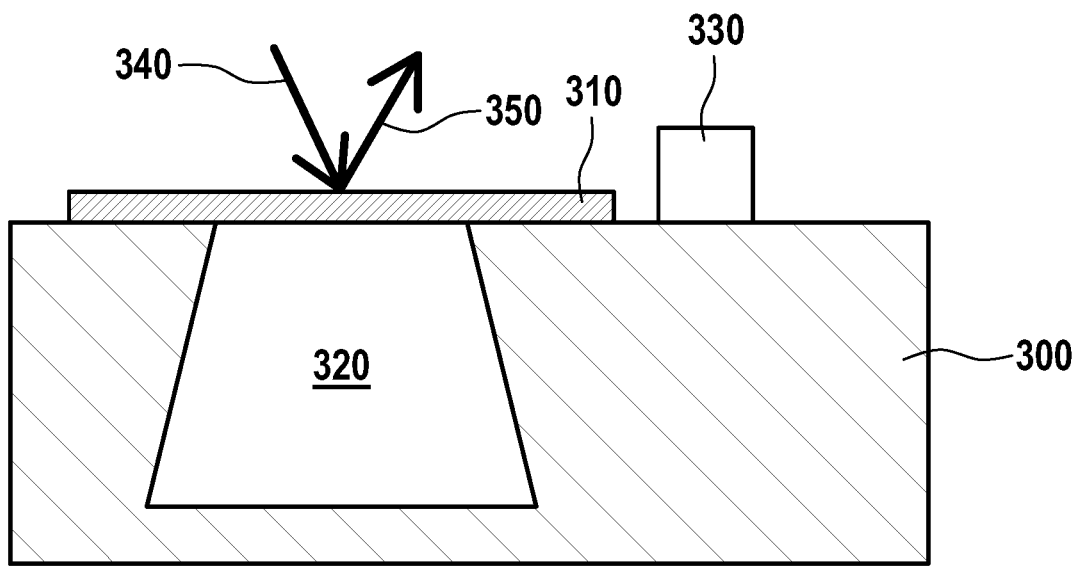
FIG. 3a shows an embodiment example of a sensor comprising a diamond membrane in cross-section.

An embodiment example is shown in cross-section in FIG. 3a. In this case, a recess 320 is made in a substrate or carrier element 300, over which a thin crystal element 310 in the form of a crystal membrane configured here as a diamond membrane is disposed. The diamond membrane 310 rests peripherally with its edge region on the carrier element and covers the recess 320. An RF antenna 330 for producing a microwave field in the measuring region is provided as well.

An application of force to the diamond membrane 310 then brings about a locally different deformation. The fluorescence signal 350 is optically excited in the usual manner, e.g., by excitation light 340 locally radiated into the crystal, and the resulting fluorescence signal 350 is acquired and processed by means of a suitable photodetection (not shown here). The detected shift in the fluorescence frequencies thereby becomes proportional to the deflection of the membrane. Depending on the desired deformation, a constant force can be applied across the entire surface of the membrane or to a part thereof. However, a force that deforms the membrane could also be applied selectively to only one or more locations of the diamond membrane.

Figure 3B:
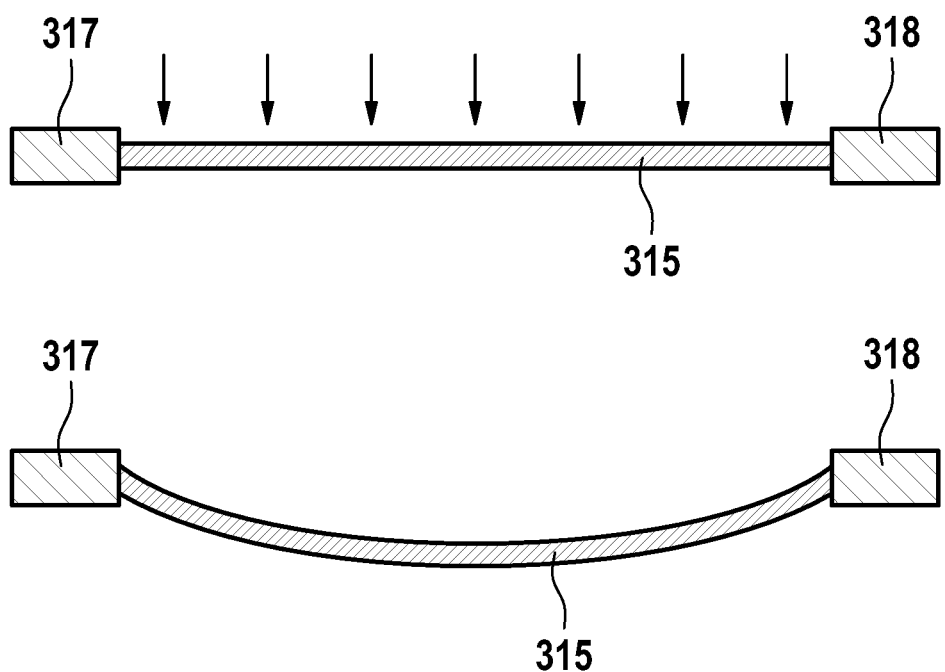
FIG. 3b shows a further embodiment example of a sensor comprising a diamond bending beam.

As a further possible embodiment, FIG. 3b schematically shows a crystal bending beam, e.g., diamond bending beam 315, which is rigidly mounted on two sides 317 and 318, once undeformed and once deformed by an application of force from above. A force can again be applied to this bending beam to bring about a uniaxial deformation of the bending beam. Uniform downward pressure can be applied from above along the length of the beam, for example, as indicated by the distributed arrows. Due to the lateral rigid mounting, deformations of different magnitudes are then achieved in different areas along the cross-section of the beam. Different strains or deformations of the crystal beam can also be expected within the diamond beam volume, or between the upper side and the underside of the beam. For example, it is possible to calculate that the greatest strain on the upper side of the bending beam occurs in the region of the rigid mounting, while on the underside, and overall the greatest strain, occurs as expected in the middle, freely movable area of the beam. As an example, it is possible to calculate that, for such a two-sidedly mounted bending beam having a width of 100 µm and a length of 2 mm at an applied pressure of 0.012 Pa, i.e., an application of force of $2.4 \cdot 10^{-10}$ N, a maximum line shift in the resonance frequency of around 24 MHz can be achieved.

Since the strains within the crystal volume differ, it is advantageous in all embodiments to in particular carry out the optical measurement in the areas of a diamond crystal in which the most constant and maximum deformation possible can be achieved. This does not have to be the area of absolute maximum deformation. In principle, however, the fluorescence signal can be excited and measured in any suitable region of a diamond crystal that corresponds to as uniaxial a strain as possible.

As a further option, it is also possible for a diamond crystal intended for measurement to ideally specifically be provided with NV centers only in the areas in which the optimum deformation for the measurement occurs. It can thus be ensured that only fluorescence signals from this area are measured. This can be realized via chemical vapor deposition (CVD) coating with NV-doped diamond on the surface of a carrier beam or a carrier membrane, for example. The selection of an exact measurement position on a beam surface or membrane can also be carried out via the positioning of the excitation beam, for example.

Figure 4A:
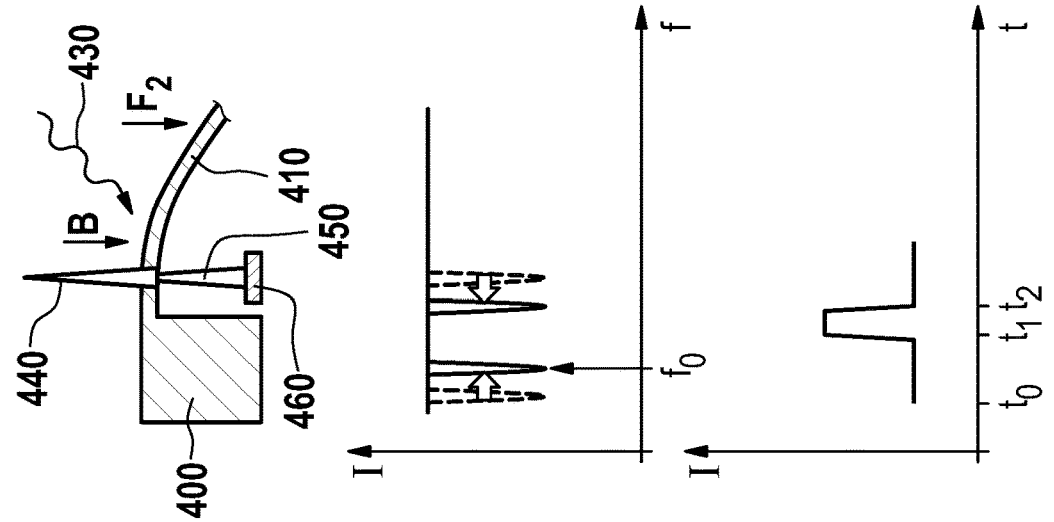
FIGS. 4a to 4c show the flow and operation of a measurement method according to one possible embodiment.

The measurement principle will now be explained in more detail as an example with reference to FIGS. 4a to 4c. The upper region of each figure shows a portion of a diamond bending beam 410 attached on one or two sides on a carrier element 400 in cross-section. In this case, a measuring region provided with NV centers has been selected in the edge region of the beam 410. There, green excitation light 440 is radiated in from above and the resulting red fluorescence light 450 is detected below the beam by a photodetector 460. A force, which deflects the beam at least partially downward and thus causes a deformation in the measuring region, can be applied to the diamond beam by means of a suitable actuator (not shown). Other elements of the system, such as microwave sources and microwave resonators, light sources and signal processing means, are not shown here.

Below that, each figure shows two graphs, wherein the upper graph shows the measured fluorescence intensity against the radiated microwave frequency, while the lower graph shows the intensity of the measurement signal at a fixed microwave frequency $f_0$ over the course of the measurement process.

In a first step (FIG. 4a), there is no external magnetic field. At a time $t_0$, a first downward force F1 is applied to the diamond beam 410, which leads to a deformation or strain in the measuring region. The force can be applied piezo-electrically, electrically or magnetically, for example. A NV center axis will be considered here as an example; the same applies to the other axes. This force is initially kept constant and ensures a corresponding separation of the resonance frequencies for the two spin states, as shown in the resulting fluorescence spectrum in FIG. 4a. However, instead of a tuned microwave spectrum, it is also possible to use a suitable source 430 to set a fixed microwave frequency $f_0$ which corresponds to the resonance frequency of a selected NV center axis and one of the spin states under the action of the force $F_1$. Thus, at time to, a minimum of the fluorescence spectrum, i.e., a minimum signal at the photodetector, can be detected with the force $F_1$ and the radiated fixed microwave frequency $f_0$.

Figure 4B:
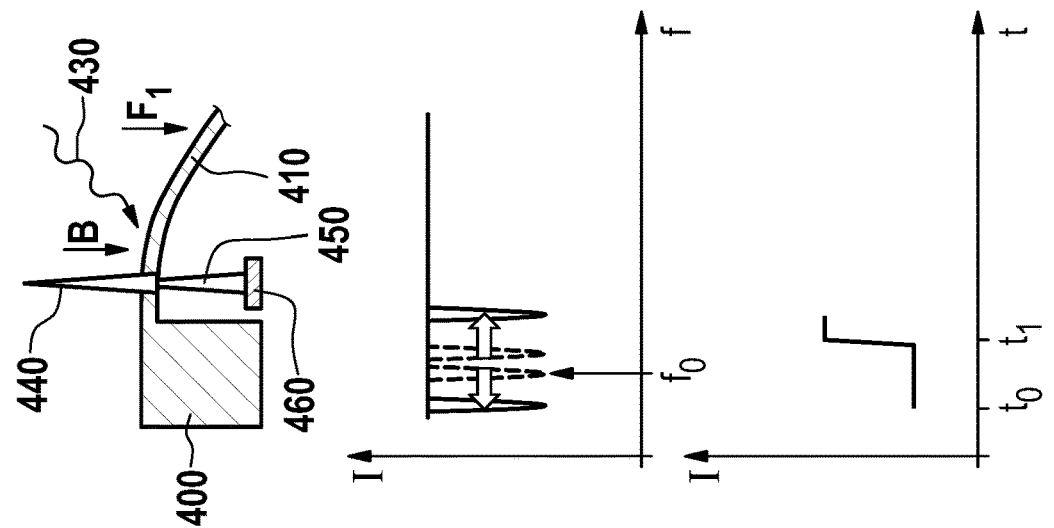

FIG. 4b shows the next step of the measurement method. Now, at time $t_1$, in addition to the still constantly applied force $F_1$, the measuring region of the diamond beam 410 can be exposed to a magnetic field B. This can in particular be a to-be-measured magnetic field B of unknown strength and direction. As already described, the magnetic field also brings about an axis- and spin-dependent shift in the resonance frequencies depending on the field components, so that the individual resonance frequency observed for the measurement also shifts along the selected axis depending on the strength of the magnetic field component. However, the radiated microwave frequency is still fixedly held at the previously found value $f_0$. The shift in the energy levels or the resonance frequency ensures that the resulting fluorescence at the microwave frequency $f_0$ moves out of the minimum, so that at time $t_1$ a suddenly increasing fluorescence signal can be measured at the detector, as shown in the lower graph.

Figure 4C:
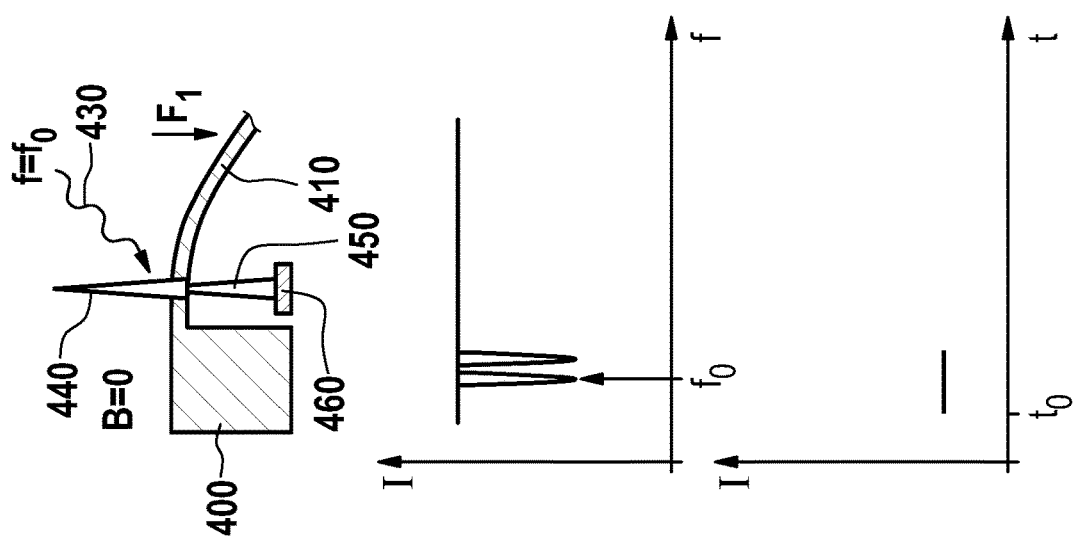

In a further step shown in FIG. 4c, the force applied on the bending beam is changed. The force can be readjusted until a fluorescence minimum is achieved again at a second applied force $F_2$ at the still unchanged microwave frequency $f_0$, i.e., until the detected fluorescence signal is again minimized. The shift in the selected resonance frequency in this step (back to frequency $f_0$) brought about by changing the force, i.e., by the difference between the forces $F_1$ and $F_2$, should therefore be exactly as large as the shift in the resonance frequency away from the frequency $f_0$ previously brought about in the magnetic field B.

Since the applied force is known (e.g., based on the control of a used piezoelectric element) and the frequency shift is proportional to the force, the frequency shift caused by the splitting of the magnetic field can be determined from the difference between the two forces $F_1$ and $F_2$. Since the frequency split or shift in the magnetic field is also proportional to the field strength, the field strength of the magnetic field along the selected axis can in turn be directly determined from this. The magnetic field strength of the magnetic field B is thus proportional to the change in force implemented between the steps of FIGS. 4b and 4c. As shown in this example, the readjustment of the force can be carried out counter to the direction of the first force $F_1$, for example, i.e., reduced again relative to the first force, so that $F_2<F_1$. However, depending on the position of the used resonance frequencies and axes, a readjustment in the other direction can be provided as well.

Since only a fixed microwave frequency $f_0$ is needed to evaluate an axis, narrowband microwave resonators can be used, which allow a locally limited high field strength even with little coupled power. This also places lesser demands on the microwave source itself.

To realize a vector magnetometer, i.e., determine the field strength and direction of an unknown magnetic field, the measurement principle described in FIG. 4 can be used on at least three of the four possible crystal axes. Multiple (at least 3) fixed microwave frequencies, which minimize the fluorescence in at least three of the four crystal axis resonances, are therefore to be radiated into the measuring region at the same time. The frequencies can also be produced by modulation, for example. To then measure multiple frequencies for multiple axes, the associated multiple microwave frequencies can be radiated in simultaneously, for example. The acting force can then be continuously readjusted, i.e., taken through a specific range of values, until all associated frequency minima for the axes of interest have been detected. The allocation of frequencies to the respective axes can be calibrated once using the crystal orientation and the application of force. The appropriate microwave frequencies can then be set based on this.

It is also possible to evaluate the strains at different locations of a single diamond structure, e.g., at different positions of a diamond bending beam or an actuatable diamond membrane. If it is assumed that the magnetic field to be measured is the same size at the two measuring locations, the field strengths obtained for each axis, for example, can be averaged or combined in some other way in order to achieve an improved measurement result. Measurement at multiple positions of a structure can be applied to all embodiments.

Figure 5B:
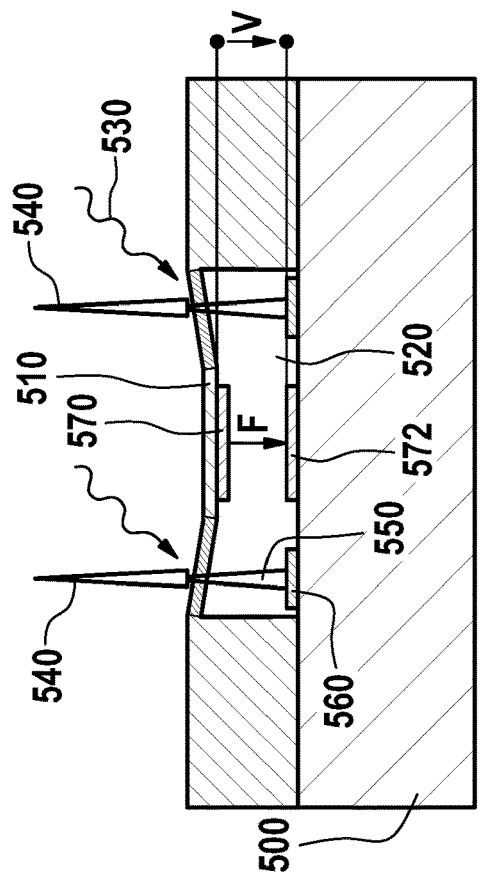
FIGS. 5a to 5c illustrate an embodiment example comprising a diamond membrane and an electrostatic actuator in cross-section and in a plan view.
Figure 5A:
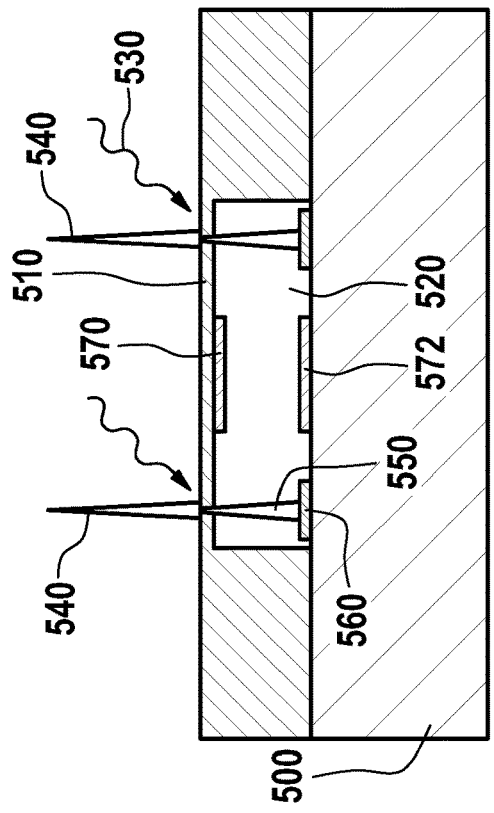
Figure 5C:
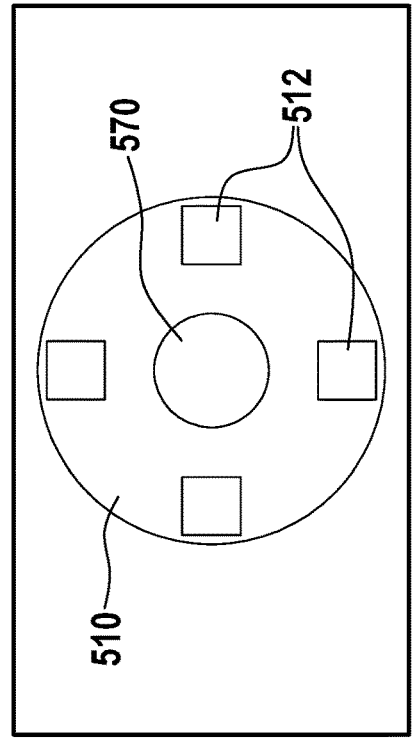

Another possible embodiment is shown in FIG. 5. FIG. 5a shows a cross-section through a magnetometer element without deflection of the movable diamond structure, while FIG. 5b shows a cross-section of the same element in a deflected state. FIG. 5c shows a schematic plan view of the magnetometer element of FIGS. 5a and 5b.

In this example, a diamond crystal element is disposed on a carrier substrate 500. A circular recess can then be cut into the element in one area to form a thin circular diamond membrane 510 that covers a cylindrical cavity 520. The cavity 520 is closed off here at the bottom by the carrier substrate 500. The magnetic resonances can be measured at one or more suitable locations 512 of the diamond membrane. In the present case, four measuring locations 512 which are evenly spaced around the periphery of the membrane are provided on the diamond membrane 510 as an example, as indicated in FIG. 5c. However, it is also possible to provide more or fewer or other areas of the membrane 510 for measurement. At least in the area of these measuring locations 512, the diamond membrane is provided with NV centers which are optically excited by excitation light 540 radiated in from above. One or more photodetectors 560 are disposed within the cavity for measuring the resulting fluorescence light 540. The photodetectors 560 can preferably be provided on the substrate 500 below the measuring locations 512 in the membrane 510 and have sufficient size and sensitivity to detect the fluorescence light.

To bring about a deflection of the diamond membrane 510 and thus a deformation in the area of the measuring locations 512, a pair of electrodes 570, 572 can be used for electrostatic actuation. A first electrode 572 can be disposed on the substrate surface 500 in the cavity 520 and a second electrode 570 can be mounted directly above it on the inner side of the diamond membrane 510. An electrical voltage can then be applied to the two electrodes 570, 572, which then produces a force between the electrodes and thus a movement of the upper electrode 570 together with the attached diamond membrane 510 in the direction of the lower electrode 572, as shown in FIG. 5b. This makes it possible to achieve an application of force across the surface of a portion of the membrane, so that the maximum deformation of the membrane takes place in the free membrane areas, i.e., in the area of the defined measuring locations. It goes without saying that the electrodes are only shown here as examples as well, and that other size proportions with respect to the membrane or other forms of electrodes are conceivable too. It is thus also possible to influence the force to the membrane as desired by the type, placement and size of the electrodes used.

Figure 6:
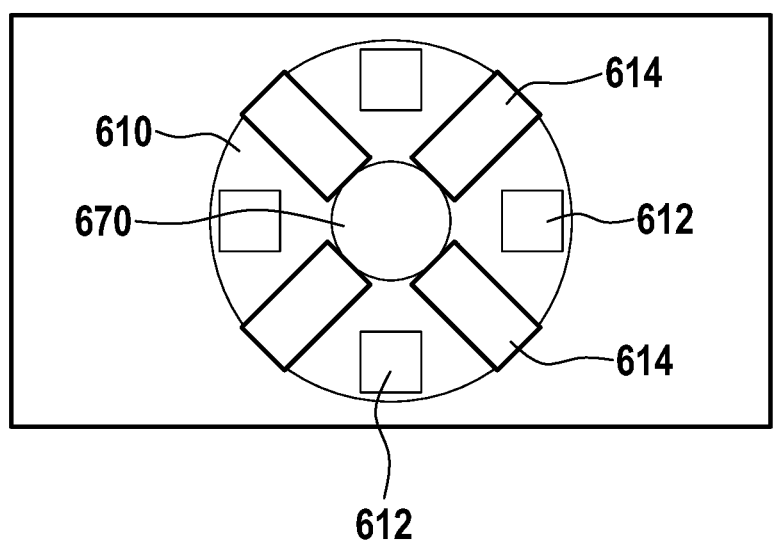
FIG. 6 shows a plan view of an alternative configuration of a diamond membrane.

FIG. 6 shows another variant of the embodiment of FIG. 5 in a plan view. In this case, portions 614 of the diamond membrane 610 were selectively removed, in this case in the form of radial cut-out strips 614. In this way, the deformation and thus also the strain on the membrane at the measuring points 612 can be increased when force is applied by means of the electrode 670. The shown sections are again to be understood only as examples and can also be designed differently. It in particular makes it possible to suitably adjust both the optimum deflection and deformation and the required thickness or stability of the diamond membrane.

Figure 7B:
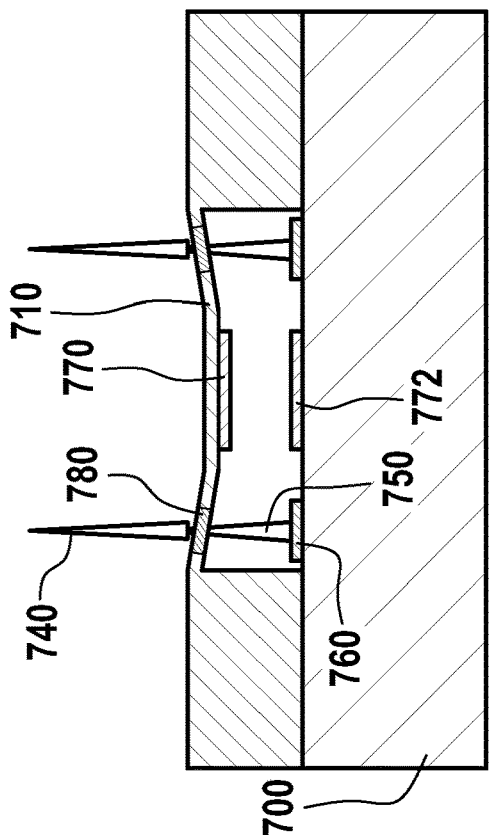
FIGS. 7a to 7c show a further embodiment example in cross-section and in plan view, in which only a portion of the diamond membrane is doped with NV centers.
Figure 7A:
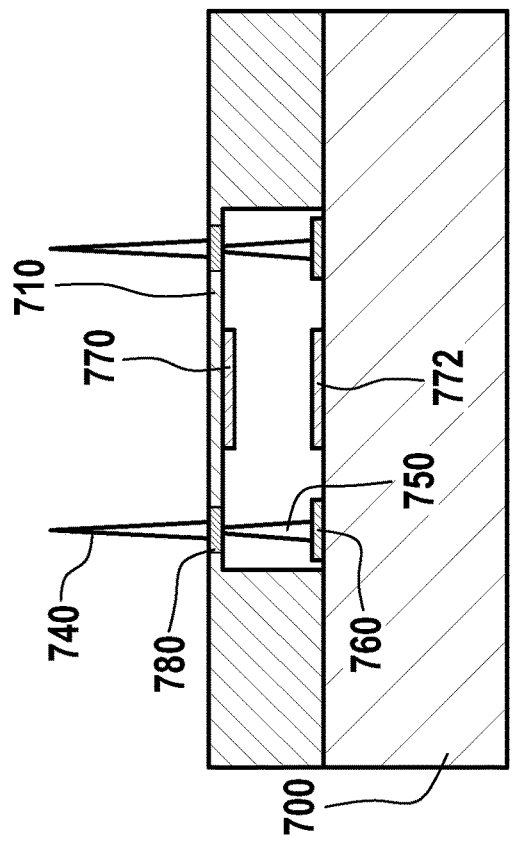
Figure 7C:
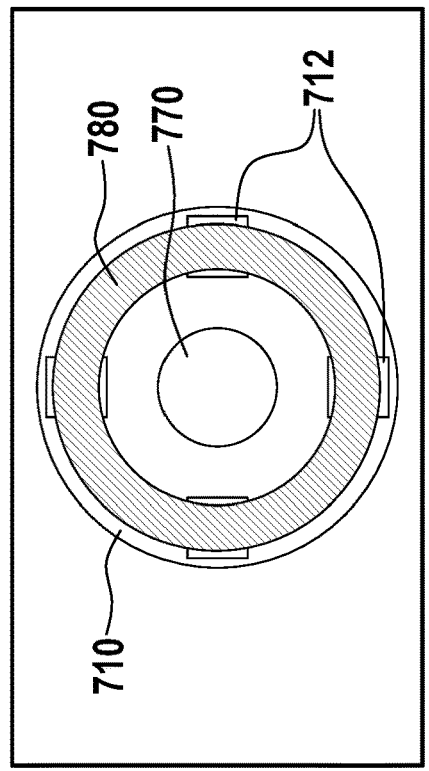

FIG. 7 shows another embodiment with a diamond membrane 710 over a cavity 720, wherein FIG. 7a shows a cross-section through a magnetometer element without deflection of the movable diamond structure, while FIG. 7b shows a cross-section of the same element in a deflected state. FIG. 7c shows a schematic plan view of the magnetometer element of FIGS. 7a and 7b. The structure consisting of diamond membrane 710, cavity 720, carrier substrate 700, photodetector 760 and electrodes 770, 772 is provided in this example as in FIG. 5 and will therefore not be described again in detail. The excitation light 740, fluorescence light 750, and microwave radiation (not shown) are likewise to be understood as in FIG. 5. However, in order to achieve that the optical fluorescence signal originates only from areas which are homogeneously and constantly strained or deformed, the diamond can in this case be provided with NV centers only in locations in which the homogeneous strain will later occur. In this example, as shown hatched in FIG. 7c, a ring-shaped area of the diamond membrane between the outer membrane edge and the electrode is doped with NV centers, while all of the other areas remain undoped. The doped area can also be selected to be larger or smaller. It could, for example, also be possible to only locally dope the areas on which a detector is actually disposed. Selective local doping can be accomplished by ion implantation, by deposition of NV-doped diamond films via CVD or by selective laser activation of NV centers, for example. For example, the number of NV centers for a magnetic field sensor can be in the range of about 10 ppb (parts per billion) to 10 ppm (parts per million). Good results are obtained in the range of about 100 ppb. At these concentrations, the quantized electron states in the NV center do not overlap yet, so that there is also no energy broadening of the allowed states, which would lead to a smearing of the fluorescence minima in the resonance spectrum and thus to undesirable losses of sensitivity.

In all embodiments, in particular in the embodiments of FIGS. 5 to 7, it makes sense to use a wafer or a printed circuit board, for example, in which elements such as the photodetectors, the electrodes for deflection and optionally also other electronic components, signal lines and similar elements are already integrated, as the substrate.

It is also possible to use other mechanisms to deflect or deform the diamond structure instead of electrostatic actuators in the form of electrodes. One option is, for example, the use of piezoelectric elements. A piezoelectric layer, e.g., made of lead zirconate titanate, can be applied to a diamond membrane, such as in the structures of the previous examples. The layer can be mounted as a surface element in the middle of a circular diamond membrane, for example. In one embodiment example, a diamond membrane having a radius in the mm range and a thickness in the µm range can be used as the sensor structure. A piezo element, the thickness of which is likewise in the µm range and has a radius of approximately 500-700 µm, can then be disposed on this diamond membrane, so that a wide, free outer ring of the diamond membrane remains as the possible measuring region. In this configuration, the maximum strain in the diamond is concentrated in the region along the edge of the piezoelectric layer, so that the described fluorescence measurement should preferably also take place in this area. Again, the entire membrane or only these relevant areas can be provided with NV centers. With a diamond membrane having a thickness of 5 µm and a radius of 1 mm on which a piezoelectric layer having a thickness of 1 µm and a radius of 0.65 mm is mounted, a deflection of the diamond membrane of approximately 4 mm can be achieved with a piezo voltage of 0.012 V, for example.

Figure 8A:
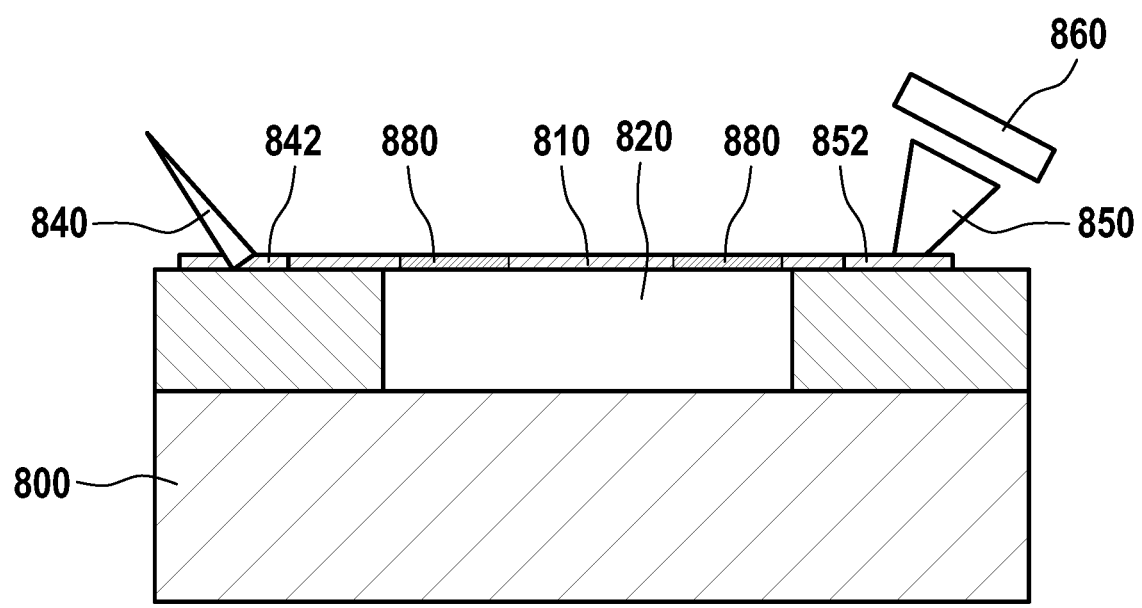
FIGS. 8a and 8b show a cross-section and a plan view of a further possible embodiment, in which a diamond bending beam is implemented as an optical waveguide.
Figure 8B:
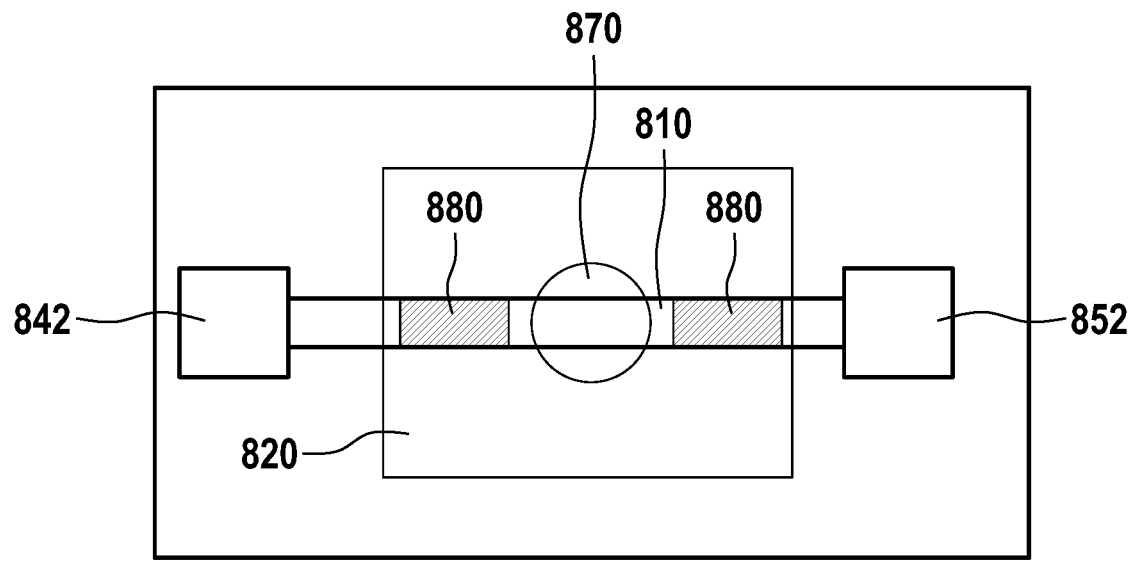

FIGS. 8a and 8b show a cross-section and a plan view of a further possible embodiment, in which a diamond bending beam 810 is implemented as an optical waveguide. Similar to the embodiments using a diamond membrane, the diamond bending beam 810 can be disposed above a cavity 820 on a carrier substrate 800, so that it can be deflected downward by means of a suitable actuator, such as the electrodes 870. Instead of radiating the excitation light from above directly onto the measuring location as shown in the examples of FIGS. 5 to 7, in this example the excitation light 840 can be guided via an optical coupling 842 into the bending beam 810 and therein to the measuring location. The fluorescence signal can then be produced in the areas 880 of the bending beam provided with NV centers as already described. The fluorescence light 850 can then likewise be guided through the bending beam 810 as a waveguide and guided there to a photodetector 860 via a decoupling structure 852. In this way, all of the elements, such as photodetectors 860 and excitation light source, can also be disposed further away from the immediate measuring location of the sensitive diamond elements 810 and both excitation and fluorescence light can be efficiently guided to the measuring location and/or from the measuring location to the detector. However, it is also possible to combine these and the previous embodiments with one another in a suitable manner, i.e., for example, couple only the excitation light and read out the fluorescence light directly at the measuring location by means of a suitable design of the diamond element.

A wider thin diamond platelet similar to a membrane, for example, is also conceivable here in place of a bending beam, as long as the coupling and decoupling of the light is sufficiently possible. Any other structures of waveguides that can be implemented as diamond with NV centers can be used here as well.

Since the magnetic field-sensitive energy levels $m_s=-1$ and $m_s=+1$ are at the same energy level without the presence of a magnetic field regardless of the voltage in the diamond crystal, a small bias magnetic field can optionally also be used in the strain-based magnetic field sensors described here to already achieve splitting. For this purpose, a small permanent magnet or a current-carrying coil, for example, can be disposed in the area of the diamond structure in order to apply a bias field of about 50-100 microtesla at the measuring location.

It goes without saying that elements of the described embodiment examples can also be varied and combined with one another in other ways. The various ways of applying force by means of electrodes or piezoelectric layers, for example, can be applied to all possible diamond structures and can also be adapted to the respective configurations. Other features, such as selective NV doping of diamond crystals in the measuring region or various arrangements of the excitation and read-out light sources relative to the diamond crystals, can also be applied to all embodiments as desired. Moreover, other elements can be used in systems according to the disclosure that have not been described in detail here and are known in the art, such as various amplifiers, filters, and evaluation units for the measured optical fluorescence signals, optical components such as mirrors, beam splitters, waveguides or optical fibers, optical filters and others, or microwave generators and supply lead elements such as high-frequency connectors and different resonator arrangements.

The described method steps can in particular also be carried out by suitable computing units or by hardware- and/or software-based control systems. Thus, a suitable control loop can be used to readjust the application of force to the diamond crystal in order to actually find the fluorescence minimum. Parts of the used parameters can be calculated or simulated during operation or even in advance or can be measured under specified conditions, such as the expected resonance frequencies without an applied magnetic field at a specified application of force to a diamond structure. Such calculations can then be used to find suitable operating frequencies for the microwave radiation, for example.

The magnetic field sensors shown here can be used in all fields for magnetic field measurement, for example in the field of consumer electronics, in navigation devices, in cable locators, but also in complex and highly sensitive applications such as magnetic field-based measurement of brain waves, which can then in turn be used for further purposes such as control or diagnostic evaluation.

The invention claimed is:

1. A method for measuring a magnetic field using a sensor, the method, comprising:
    radiating a microwave field having a first frequency into at least one measuring location in a crystal, which comprises optically excitable color center defects at least at the at least one measuring location;
    radiating excitation light into the at least one measuring location and detecting resulting fluorescence light from the at least one measuring location;
    applying a deformation force to the crystal which results in local mechanical strain at least in an area of the at least one measuring location, the applying of the deformation force including applying a first deformation force that is selected such that the first frequency corresponds to a resonance frequency of the color center defects under the application of the first deformation force without the magnetic field to be measured and the detected fluorescence light becomes minimal;
    placing the sensor into the magnetic field to be measured in order to bring about a shift in the resonance frequency; and
    varying the deformation force applied to the crystal to compensate for the shift in the resonance frequency until a minimum fluorescence signal is again acquired at a second deformation force.

2. The method according to claim 1, further comprising: determining the field strength of the magnetic field to be measured on the basis of a difference between the first and the second deformation forces.

3. The method according to claim 1, further comprising:
    radiating microwave fields having two or more frequencies, wherein each of the two or more frequencies corresponds to a resonance frequency of the color center defects for an alignment axis of the color center defects in the crystal under the action of the first deformation force without the magnetic field to be measured;
    varying the deformation force after introduction into the magnetic field until a minimum fluorescence signal is again acquired for each of the radiated frequencies at a third deformation force; and
    determining the field strength of the magnetic field to be measured in the direction of the alignment axis assigned to the radiated frequency on the basis of a difference between the first and the third deformation forces.

4. A magnetic field sensor for measuring a magnetic field, comprising:
    a crystal, which comprises optically excitable color center defects at least at one or more measuring locations;
    a fluorescence module configured to optically excite the color center defects at the one or more measuring locations and acquiring a resulting fluorescence light signal from the one or more measuring locations;
    an actuator configured to produce mechanical strains at least at the one or more measuring locations in the crystal by applying a defined variable deformation force;
    a microwave generator configured to produce a microwave field with a predetermined frequency at the one or more measuring locations; and
    a measurement module configured to control the actuator depending on the acquired fluorescence signal and to detect the deformation force applied by the actuator at least at a fluorescence minimum.

5. The magnetic field sensor according to claim 4, wherein the measurement module is further configured to:
    control the actuator to apply a first deformation force, which is selected such that the first frequency corresponds to a resonance frequency of the color center defects under the action of the first deformation force without the magnetic field to be measured and the detected fluorescence light is minimal; and
    control the actuator to vary the applied deformation force if the detected fluorescence light is no longer minimal due to the action of an external magnetic field until a minimum fluorescence signal is again acquired at a second deformation force.

6. The magnetic field sensor according to claim 5, wherein the measurement module is further configured to determine the field strength of the magnetic field to be measured on the basis of a difference between the first and the second deformation forces.

7. The magnetic field sensor according to claim 4, wherein the crystal is partly or entirely configured as a crystal membrane.

8. The magnetic field sensor according to claim 7, wherein the crystal membrane defines recesses that alter the deformation and/or strain properties of the crystal membrane.

9. The magnetic field sensor according to claim 4, wherein the crystal is partly or entirely configured as a crystal bending beam, which is rigidly attached on one or on both sides.

10. The magnetic field sensor according to claim 4, wherein the fluorescence module comprises:
    at least one excitation light source configured to radiate excitation light into the one or more measuring locations; and
    at least one photodetector configured to detect fluorescence light at one or more of the measuring locations, wherein the crystal is configured as an optical waveguide that guides excitation light to the one or more measuring locations and/or guides fluorescence light away from the one or more measuring locations to the at least one photodetector.

11. The magnetic field sensor according to claim 4, wherein the actuator comprises a piezoelectric actuator or an electrostatic actuator.

12. The magnetic field sensor according to claim 4, further comprising:
    a carrier substrate on which the crystal is mounted such that a recess is formed between the carrier substrate and the one or more measuring locations,
    wherein the actuator is disposed on the crystal such that deflection of the crystal by the actuator is possible at least in portions of the crystal.

13. The magnetic field sensor according to claim 12, wherein at least part of the fluorescence module is accommodated in the recess.

14. A computing unit comprising at least one memory having stored program instructions executed by the computing unit to carry out the method according to claim 1.

15. A computer program comprising program instructions executed by a computing unit to carry out the method according to claim 1.

16. A non-transitory machine-readable storage medium on which the computer program according to claim 15 is stored.

* * * * *